(12) United States Patent
Ueda

(10) Patent No.: US 6,232,816 B1
(45) Date of Patent: May 15, 2001

(54) SIGNAL LEVEL MONITORING CIRCUIT

(75) Inventor: Tomio Ueda, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/139,779

(22) Filed: Aug. 25, 1998

(30) Foreign Application Priority Data

Mar. 18, 1998 (JP) ................................. 10-068150

(51) Int. Cl.[7] ................................. G01R 19/165
(52) U.S. Cl. ................. 327/307; 327/561; 330/11
(58) Field of Search .................. 327/307, 561, 327/58, 77; 330/11, 69, 98

(56) References Cited

U.S. PATENT DOCUMENTS

| | | | |
|---|---|---|---|
| 3,911,291 | * 10/1975 | Rossell | 327/104 |
| 4,016,557 | * 4/1977 | Zitelli et al. | 330/124 R |
| 4,074,204 | * 2/1978 | Broburg et al. | 330/98 |
| 4,138,641 | * 2/1979 | Karlin et al. | 330/149 |
| 4,764,752 | * 8/1988 | Ormond | 327/307 |
| 5,119,404 | * 6/1992 | Aihara | 330/69 |
| 5,642,070 | * 6/1997 | Furukawa | 327/307 |
| 5,661,423 | * 8/1997 | Mizuhara | 327/307 |
| 5,914,635 | * 6/1999 | Yamamoto | 327/561 |

* cited by examiner

Primary Examiner—Timothy P. Callahan
Assistant Examiner—Terry L. Englund
(74) Attorney, Agent, or Firm—Helfgott & Karas, P.C.

(57) ABSTRACT

A signal level monitoring circuit for outputting either voltage or current corresponding to an input signal level, includes a variable gain unit for obtaining a predetermined output level without being dependent on a gain, when the input signal level is a predetermined reference input level; and an offset adding unit for outputting a predetermined reference output level by adding an offset level to the output level of the variable gain means, when the input signal level is the predetermined reference input level. According to the present invention, it is possible to adjust precisely and surely the gain and the offset voltage based on simple adjusting steps in a short time and only once.

2 Claims, 8 Drawing Sheets

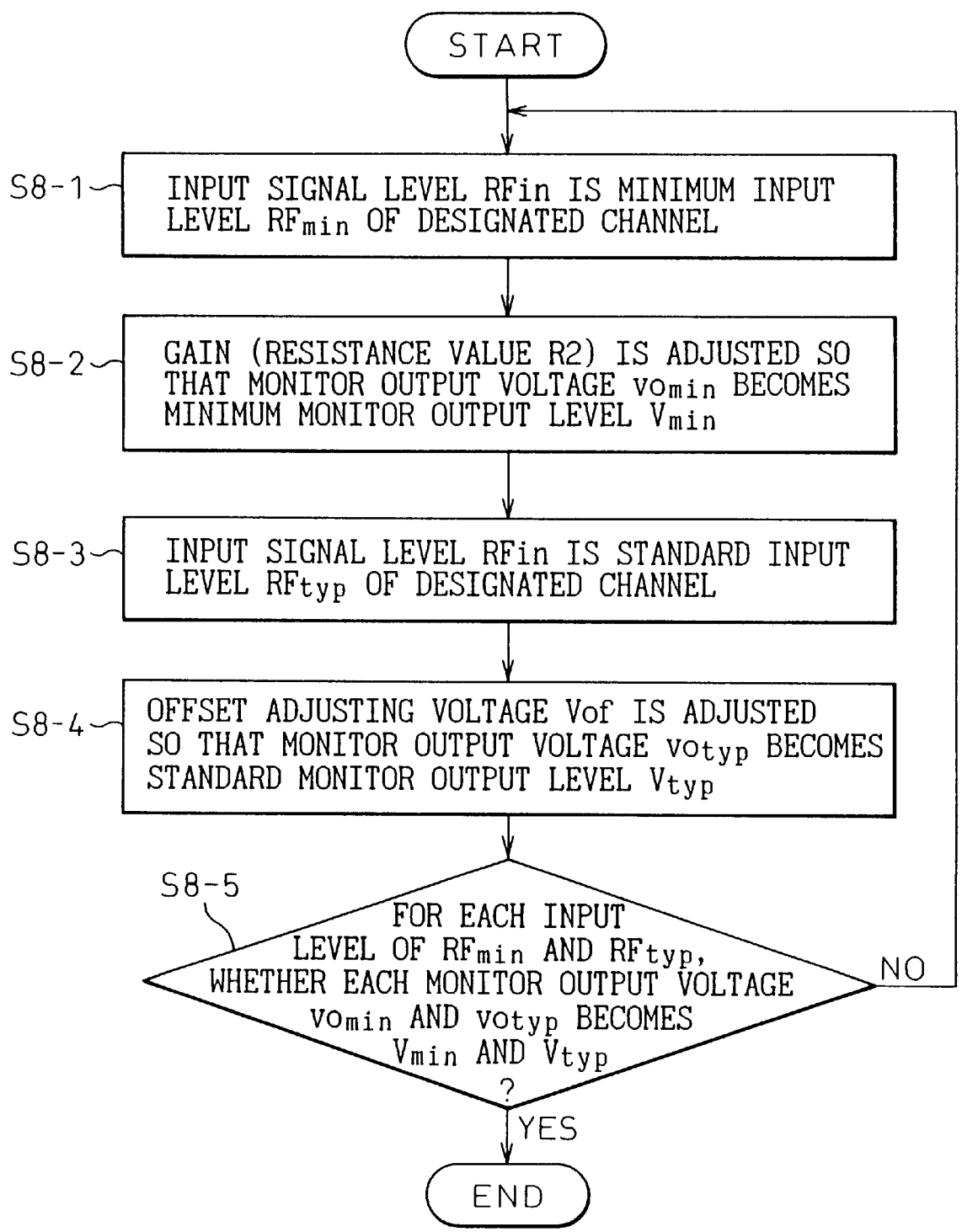

SIGNAL LEVEL MONITORING CIRCUIT

BACKGROUND OF THE INVENTION

1. Field of the Invention

The present invention relates to a signal level monitoring circuit for outputting voltage or current corresponding to an input signal level, particularly, a transmitting signal level which is output from a transmitting unit or a received signal level which is input to a receiving unit, in a multiplex communication apparatus used in microwave band (below, microwave multiplex communication apparatus).

2. Description of the Related Art

In general, a microwave multiplex communication apparatus includes a meter and the like, for displaying the transmitting signal level from the transmitting unit and the received signal level in the receiving unit, and has a structure which can monitor the transmitting signal level or the received signal level by converting a value displayed on the meter to a predetermined signal level by using a predetermined conversion table.

Accordingly, the transmitting unit or the receiving unit provided in the microwave multiplex communication apparatus comprises a signal level monitoring circuit consisting of a detector for detecting a transmitting signal or a received signal and an amplifier for amplifying an output signal level from the detector, in order to monitor the transmitting signal level or the received signal level; and a display unit, such as a meter, for displaying an output signal level from the signal level monitoring circuit.

Further, the signal level from the signal level monitoring circuit must be adjusted so that, when an input signal level RFin to the detector is a minimum input level $RF_{min}$, the signal level from the monitoring circuit becomes a predetermined minimum monitor output level $V_{min}$. Further, when the input signal level RFin to the detector is a standard input level $RF_{typ}$ the signal level from the monitoring circuit becomes a predetermined standard monitor output level $V_{typ}$.

In order to provide a structure in which the minimum monitor output level Vmin and the standard monitor output level $V_{typ}$ of the monitor output signal are the predetermined values and the level of the monitor output signal can be adjusted so as to coincide with these output levels $V_{min}$ and $V_{typ}$, a direct current amplifying circuit (below, a DC amplifier) which can determine an optional gain and an offset value, is used as the signal level monitoring circuit.

SUMMARY OF THE INVENTION

The object of the present invention is to provide a signal level monitoring circuit which can adjust precisely and surely the gain and the offset voltage based on simple adjusting steps in a short time and only once.

In accordance with the first aspect of the present invention, there is provided a signal level monitoring circuit for outputting either voltage or current corresponding to an input signal level, including:

a variable gain unit for obtaining a predetermined output level without being dependent on a gain, when the input signal level is a predetermined reference input level; and an offset adding unit for outputting a predetermined reference output level by adding an offset level to the output level of the variable gain means, when the input signal level is the predetermined reference input level.

In a preferred embodiment, the signal level monitoring circuit further includes;

a first offset adding unit for adding the offset level so that the output level of the variable gain unit becomes zero volt, when the input signal level is the predetermined reference input level;

a second offset adding unit for outputting the predetermined reference output level by adding the offset level to the output level of the variable gain unit, when the input signal level is the predetermined reference input level; and a gain adjusting unit for adjusting the gain of the variable gain unit.

In another preferred embodiment, the first offset adding unit and the gain adjusting unit are formed by an amplifier using one operational amplifier.

In accordance with a second aspect of the present invention, there is provided a signal level monitoring circuit comprising a first amplifier using a first operational amplifier and a second amplifier using a second operational amplifier and connected to the first amplifier, characterized in that:

an output terminal of a detector (4-1) is connected to one input terminal of the first operational amplifier (4-21);

one terminal of a first resistor (R1) is connected to a first offset adjusting voltage terminal (Vr) and the other terminal of the first resistor (R1) is connected to the other input terminal of the first operational amplifier (4-21);

one terminal of a second resistor (R2) is connected to an output terminal of the first operational amplifier (4-21) and the other terminal of the second resistor (R2) is connected to the other input terminal of the first operational amplifier (4-21);

one terminal of a third resistor (R3) is connected to the output terminal of the first operational amplifier (4-21), and the other terminal of the third resistor (R3) is connected to one input terminal of the second operational amplifier (4-22);

one terminal of a fourth resistor (R4) is connected to an output terminal of the second operational amplifier (4-22), and the other terminal of the fourth resistor (R4) is connected to one terminal of the second amplifier (4-22);

one terminal of a fifth resistor (R5) is connected to a second offset adjusting voltage terminal (Vof), and the other terminal of the fifth resistor (R5) is connected to one terminal of the second operational resistor (4-22);

one terminal of a sixth resistor (R6) is connected to the first offset adjusting voltage terminal (Vr), and the other terminal of the sixth resistor (R6) is connected to the other input terminal of the second operational amplifier (4-22); and one terminal of a seventh resistor (R7) is connected to the ground, and the other terminal of the seventh resistor (R7) is connected to the sixth resistor (R6);

wherein a ratio between resistance values of the sixth and seventh resistors (R6, R7) is equal to a ratio between a resistance value of the third resistor (R3) and a parallel combined resistance value of the fourth and fifth resistors (R4, R5).

In accordance with a third aspect of the present invention, there is provided a signal level monitoring circuit comprising a first amplifier using a first operational amplifier and a second amplifier adding an offset voltage to the first amplifier, characterized in that:

an output terminal of a detector (5-1) is connected to one input terminal of the first operational amplifier (5-21);

one terminal of a first resistor (R1) is connected to the other input terminal of the first operational amplifier (5-21), and the other terminal of the first resistor (R1) is connected to a first offset adjusting voltage terminal (Vr);

one input terminal of a second resistor (R2) is connected to the other input terminal of the first operational amplifier (5-21), and the other terminal of the second resistor (R2) is connected to an output terminal of the first operational amplifier (5-21);

one terminal of a second operational amplifier (5-22) is connected to the first offset adjusting voltage terminal (Vr);

one terminal of a third resistor (R3) is connected to the other input terminal of the second operational amplifier (5-22), and the other terminal of the third resistor (R3) is connected to a second offset adjusting voltage terminal (Vof);

one terminal of a fourth resistor (R4) is connected to an output terminal of the second operational amplifier (5-22), and the other terminal of the fourth resistor (R4) is connected to the other input terminal of the second operational amplifier (5-22);

one terminal of a fifth resistor (R5) is connected to the output terminal of the second operational amplifier (5-22), and the output terminal of the second operational amplifier (5-22) is connected to the other input terminal of the first operational amplifier (5-21) through the fifth resistor (R5);

wherein the ratio of the resistance values of the third and fourth resistors (R3, R4) is equal to the ratio of the resistance values of the second and third resistors (R2, R3).

In accordance with a fourth aspect of the present invention, there is provided a signal level monitoring circuit comprising a first amplifier using a first operational amplifier and a second amplifier using a second operational amplifier and connected to the first amplifier, characterized in that:

a first offset adjusting voltage terminal is connected to one input terminal of the first operational amplifier (6-21);

one terminal of a first resistor (R1) is connected to a detector (6-1), and the other terminal of the first resistor (R1) is connected to the other input terminal of the first operational amplifier (6-21);

one terminal of a second resistor (R2) is connected to the other input terminal of the first operational amplifier (6-21), and the other terminal of the second resistor (R2) is connected to an output terminal of the first operational amplifier (6-21);

the output terminal of the first operational amplifier (6-21) is connected to one input terminal of a second operational amplifier (6-22);

one terminal of a third resistor (R3) is connected to a second offset adjusting voltage terminal (Vof), and the other terminal of the resistor (R3) is connected to the other input terminal of the second operational amplifier (6-22); and one terminal of a fourth resistor (R4) is connected to an output of the second operational amplifier (6-22), and the other terminal of the fourth resistor (R4) is connected to the other input terminal of the second operational amplifier (6-22).

BRIEF DESCRIPTION OF THE DRAWINGS

In the drawings:

FIG. 8 is a flowchart for explaining the adjusting steps of the signal level monitoring circuit in the conventional art.

DESCRIPTION OF THE PREFERRED EMBODIMENTS

Before describing the preferred embodiments, a conventional circuit and its problem will be explained in detail below.

Figure 7:
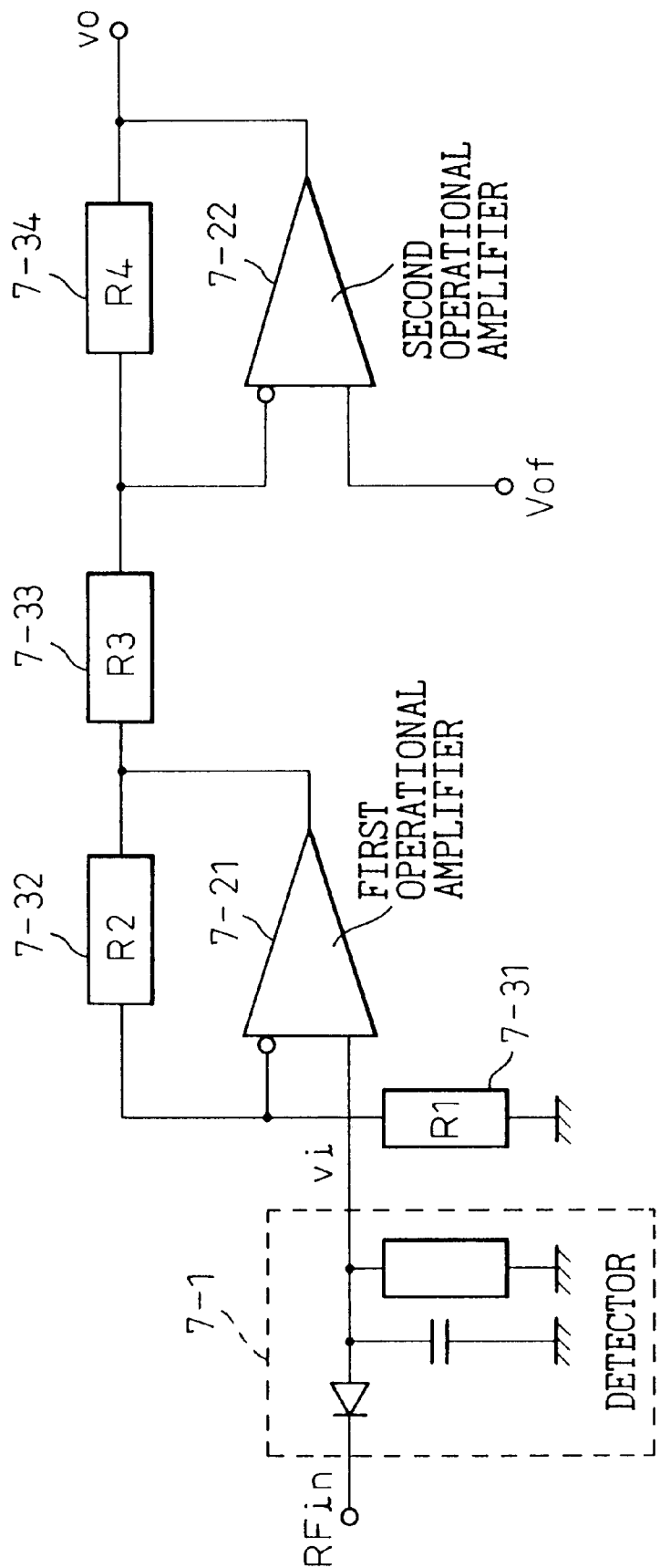
FIG. 7 is a structural view of a signal level monitoring circuit according to the conventional art.

FIG. 7 is a structural view of a signal level monitoring circuit according to a conventional art. In FIG. 7, reference number 7-1 is a detector for monitoring an input signal level, 7-21 and 7-22 are first and second operational amplifiers, 7-31 to 7-34 are first to fourth resistors, R1 to R4 are resistance values, and Vof is an offset adjusting voltage.

The detector 7-1 receives the transmitting signal from the transmitting unit and the receiving signal from the receiving unit, detects a predetermined channel signal, and outputs a detected signal.

The first operational amplifier 7-21 and the first and second resistors 7-31 and 7-32 constitute the DC amplifier which can determine an optional gain by adjusting the resistance value R2.

Further, the second operational amplifier 7-22 and the third and fourth resistors 7-33 and 7-34 constitutes the DC amplifier which can determine an optional offset voltage by adjusting the offset adjusting voltage Vof applied to the second operational amplifier 7-22.

When the voltage input from the detector 7-1 is "vi", and when the voltage (i.e., monitor output voltage) output from the second operational amplifier 7-22 is "vo", the monitor output voltage "vo" in the signal level monitoring circuit shown in FIG. 7 can be expressed by the following formula.

$$vo = (1 + (R2/R1)) \cdot R4/R3 \cdot vi + (1 + (R4/R3)) \cdot Vof \quad (1)$$

As mentioned above, the monitor output voltage "vo" must be adjusted so that, when the input signal level RFin to the detector is the minimum input level $RF_{min}$, the monitor output voltage becomes the predetermined minimum monitor output level $V_{min}$. Further, when the input signal level RFin to the detector is the standard input level $RF_{typ}$, the monitor output voltage becomes the predetermined standard monitor output level $V_{typ}$.

Where, when the input signal level RFin is the standard input signal level $RF_{typ}$, the input voltage from the detector 7-1 is $vi_{typ}$, and the monitor output voltage at that time is $vo_{typ}$. The monitor output voltage $vo_{typ}$ can be expressed by the following formula (2). Further, when the input signal level RFin is the minimum input level $RF_{min}$, the input voltage is $vi_{min}$. When the monitor output voltage at that time is $vo_{min}$, the monitor output voltage $vo_{min}$ can be expressed by the following formula (3).

$$vo_{typ} = -(1+(R2/R1)) \cdot R4/R3 \cdot vi_{typ} + (1+(R4/R3)) \cdot Vof \quad (2)$$

$$vo_{min} = -(1+(R2/R1)) \cdot R4/R3 \cdot Vi_{min} + (1+(R4/R3)) \cdot Vof \quad (3)$$

Where the gain and the offset voltage of the signal level monitoring circuit must be adjusted as the monitor output voltage $vo_{typ}$ at the standard input signal level $RF_{typ}$ coincides with the predetermined standard monitor output level $V_{typ}$, or as the monitor output voltage $vo_{min}$ at the minimum input signal level $RF_{min}$ coincides with the predetermined minimum monitor output level $V_{min}$. That is, the gain and the offset voltage must be adjusted so as to become $V_{typ} = vo_{typ}$ and $V_{min} = vo_{min}$.

In this case, when the gain and the offset voltage are adjusted by adjusting the resistance value R2 and the offset adjusting voltage Vof to be applied, the resistance value R2 and the offset adjusting value, both being unknown, can be obtained by calculation, i.e., by solving the simultaneous equations of the formula (2) and (3), as $vo_{typ}$ of the formula (2) is $V_{typ}$, and as $vo_{min}$ of the formula (3) is $V_{min}$.

Further, in this case, although only one solution exists theoretically when solving the simultaneous equations of the formula (2) and (3), actually, since there is a dispersion in the resistance values, the resistance value R2 and the offset adjusting voltage Vof must be adjusted by adding the standard input signal level $RF_{typ}$ and the minimum input level $RF_{min}$ and by reading the scale of the meter.

FIG. 8 is a flowchart for explaining the adjusting steps of a signal level monitoring circuit in the conventional art. In step S8-1, the minimum input level $RF_{min}$ of the designated channel is input to the input signal level RFin. That is, the input signal level RFin is the minimum input level $RF_{min}$ of the designated channel. In step S8-2, the gain (i.e., resistance value R2) is adjusted based on an error between the monitor output voltage $vo_{min}$ and the minimum monitor output level $V_{min}$. That is, the gain (i.e., resistance value R2) is adjusted so that the monitor output voltage $VO_{min}$ becomes the minimum monitor output level $V_{min}$.

Next, in step S8-3, the standard input level $RF_{typ}$ of the designated channel is input to the input signal level RFin. That is, the input signal level RFin is the standard input level $RF_{typ}$ of the designated channel. In step S8-4, the offset adjusting voltage Vof is adjusted based on an error between the monitor output voltage $vo_{typ}$ and the standard monitor output level $V_{typ}$. That is, the offset adjusting voltage Vof is adjusted so that the monitor output voltage $vo_{typ}$ becomes the standard monitor output level $V_{typ}$.

Next, in step S8-5, for each input level of the minimum input level $RF_{min}$ and the standard input signal level $RF_{typ}$, the confirming operation is performed as to whether each monitor output voltage $vo_{min}$ and $vo_{typ}$ becomes the minimum monitor output level $V_{min}$ and the standard monitor output level $V_{typ}$. In this case, when each monitor output voltage $vo_{min}$ and $vo_{typ}$ is not the minimum monitor output level $V_{min}$ and the standard monitor output level $V_{typ}$ ("NO" in step S8-5), the process is returned to the initial step S8-1, and the gain and offset voltage are adjusted again.

In the above-mentioned adjustment of the gain and offset voltage of the conventional signal level monitor circuit, the resistance value R2 for adjusting the gain and the offset adjusting voltage Vof must be adjusted to an optimum value. In this case, when adjusting the optimum value, it cannot be adjusted by the simple steps of first determining the resistance value R2, and next, determining the offset adjusting voltage Vof so that the adjustment is completed.

This is because, as is obvious from the formulas (2) and (3), the monitor output voltage $vo_{min}$ for the minimum input level $RF_{min}$ and the monitor output voltage $vo_{typ}$ for the standard input signal level $RF_{typ}$ are dependent on both the resistance value R2 and the offset adjusting voltage Vof, and are not determined simply based on setting of either the resistance value R2 or the offset adjusting voltage Vof.

Accordingly, as shown in FIG. 8, the adjustment for both the resistance R2 and offset adjusting voltage Vof, must be performed by trial and error based on the error between the monitor output voltage $vo_{min}$ and the minimum monitor output level $V_{min}$, and the error between the monitor output voltage $vo_{typ}$ and the standard monitor output level $V_{typ}$. As a result, there is the problem that the above work is very difficult and complicated.

Therefore, the present invention aims to provide a signal level monitoring circuit which can adjust precisely and surely the gain and the offset voltage based on a simple adjusting step in a short time and only once.

Figure 1:
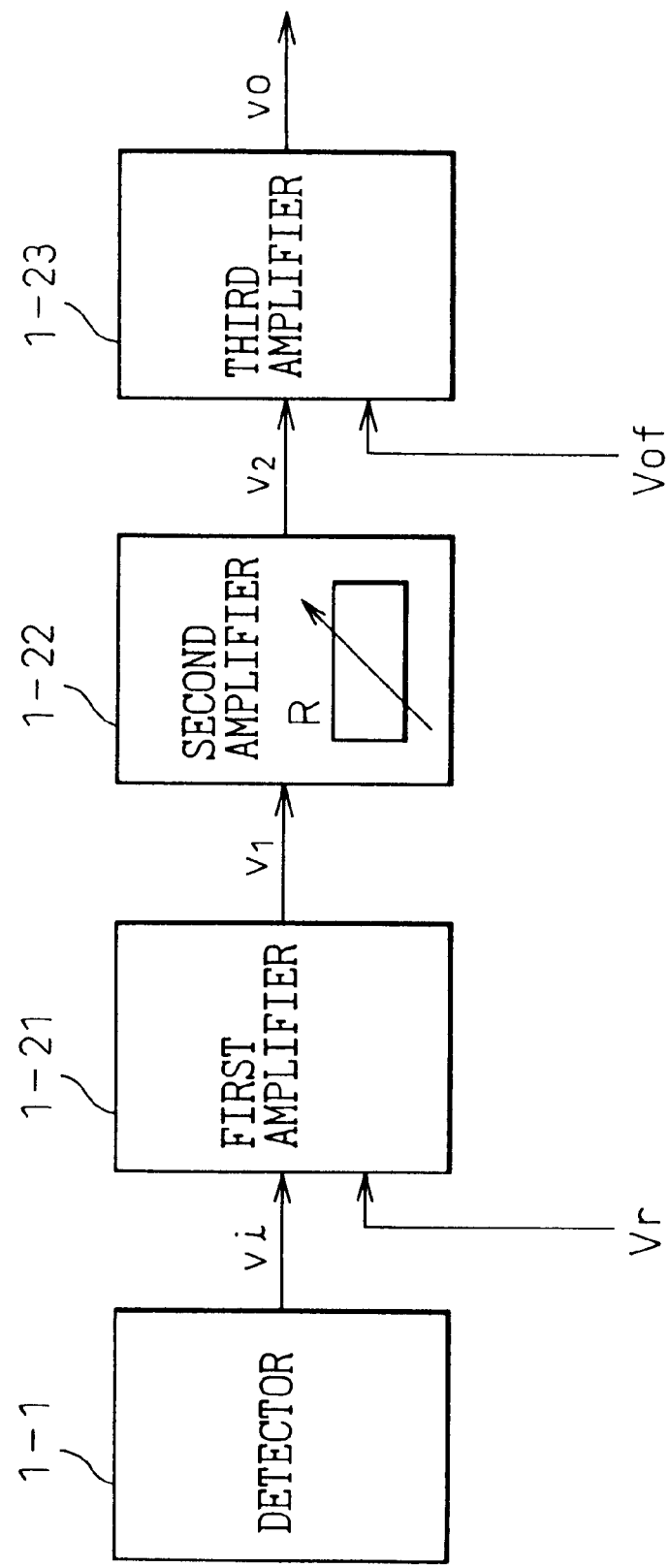
FIG. 1 is a principle explanatory view of a signal monitoring circuit according to the present invention.

FIG. 1 is a principle explanatory view of a signal monitoring circuit according to the present invention. In FIG. 1, reference number 1-1 is a detector for monitoring an input signal level, 1-21 is a first amplifier, 1-22 is a second amplifier, and 1-23 is a third amplifier. Further, "Vr" is an offset adjusting voltage applied to the first amplifier 1-21. "R" is a resistance value for adjusting the gain of the second amplifier 1-22. "Vof" is an offset adjusting voltage applied to the third amplifier 1-23.

In this case, "vi" is an input voltage which is output from the detector 1-1 and is input to the first amplifier 1-21, "$v_1$" is an output voltage from the first amplifier 1-21, "$V_2$" is an output voltage from the second amplifier 1-22, and "vo" is an output voltage from the third amplifier 1-23.

The first amplifier 1-21 is a direct current amplifier (DC-AMP) which outputs the voltage $v_1$ for adding a predetermined offset voltage to the input voltage vi, and functions as an offset adding means. The offset voltage can be optionally adjusted by adjusting the offset adjusting voltage Vr. The output voltage $v_1$ of the first amplifier 1-21 can be expressed by the following formula.

$$v_1 = vi - Vr \quad (4)$$

The second amplifier 1-22 is the direct current amplifier (DC-AMP) which outputs the output voltage $V_2$ for multiplying the gain "k" by the output voltage $v_1$ of the first amplifier 1-21, and functions as a variable gain means. The gain can be optionally adjusted by the resistance value R. The output voltage $V_2$ of the second amplifier 1-22 can be expressed by the following formula.

$$V_2 = k \cdot V_1 \quad (5)$$

The third amplifier 1-23 is the direct current amplifier (DC-AMP) which outputs the voltage vo for adding a predetermined offset voltage to the input voltage $V_2$, and functions as an offset adding means. The offset voltage can be optionally adjusted by adjusting the offset adjusting voltage Vof. The output voltage vo of the third amplifier 1-23 can be expressed by the following formula.

$$vo = v_2 + Vof \quad (6)$$

When the input signal level RFin is the standard input signal level $RF_{typ}$, the output voltage of the detector 1-1 is $vi_{typ}$.

First, the signal having the standard input signal level $RF_{typ}$ is added to the detector 1-1 so that the input voltage vi, which is input to the first amplifier 1-21, is $vi_{typ}$.

At that time, the offset adjusting voltage Vr is adjusted so that the output voltage $v_1$ of the first amplifier 1-21 becomes 0 volt (i.e., in the formula (4), $0=vi_{typ}-Vr$).

Accordingly, the offset adjusting voltage Vr becomes equal to the input voltage $vi_{typ}$, and the formula (4) becomes the following formula (7). At that time (i.e., when $vi=vi_{typ}$), the output voltage $V_2$ of the second amplifier 1-22 is 0 volt.

$$v_1 = vi - vi_{typ} \tag{7}$$

Next, in this state, the offset adjusting voltage Vof is adjusted so that the output voltage vo (i.e., monitor output voltage) of the third amplifier 1-23 becomes a predetermined standard monitor output level $V_{typ}$ (i.e., in the formula (6), $V_{typ}=0+Vof$).

Accordingly, the offset adjusting voltage Vof becomes equal to the predetermined standard monitor output level $V_{typ}$, and the formula (6) becomes the following formula (8).

$$vo = v_2 + V_{typ} \tag{8}$$

When the signal having the standard input level $RF_{typ}$ is added to the detector 1-1 (i.e., when $vi=vi_{typ}$), the output voltage $V_2$ of the second amplifier 1-22 is 0 volt so that the output voltage vo (i.e., monitor output voltage) of the third amplifier 1-23 is always constant regardless the gain of the second amplifier 1-22 and becomes the value $V_{tpy}$ of the offset voltage Vof.

Next, when the input signal level $RF_{in}$ is the minimum input level $RF_{min}$, the gain k of the second amplifier 1-22 is adjusted so that the output voltage (i.e., monitor output voltage) $vo_{min}$ of the third amplifier 1-23 becomes a predetermined minimum output level $V_{min}$.

As mentioned above, since the adjustment of the gain k of the second amplifier 1-22 does not influence the monitor output voltage $vo_{typ}$ when the signal having the standard input signal level $RF_{typ}$ is added, it is possible to complete the adjustment of the signal level monitor circuit by performing once the adjustment of the offset adjusting voltage Vr, Vof and the resistance value R. As a result, there is no repetition loop which was required in conventional adjustment steps.

The first amplifier 1-21 and the second amplifier 1-22 can be formed by the DC amplifier including one operational amplifier, and it is possible to form the variable gain means outputting the predetermined output level, which is not dependent on the gain, when the input signal level is the predetermined reference input level, by using the DC amplifier including the operational amplifier.

Further, when the input signal level is the predetermined reference input level, the output voltage from the variable gain means is not required as it is always zero volt, and the positive or negative voltage can be used if the output voltage is not dependent on the gain.

The detailed structure of the signal level monitoring circuit according to embodiments of the present invention.

Figure 2:
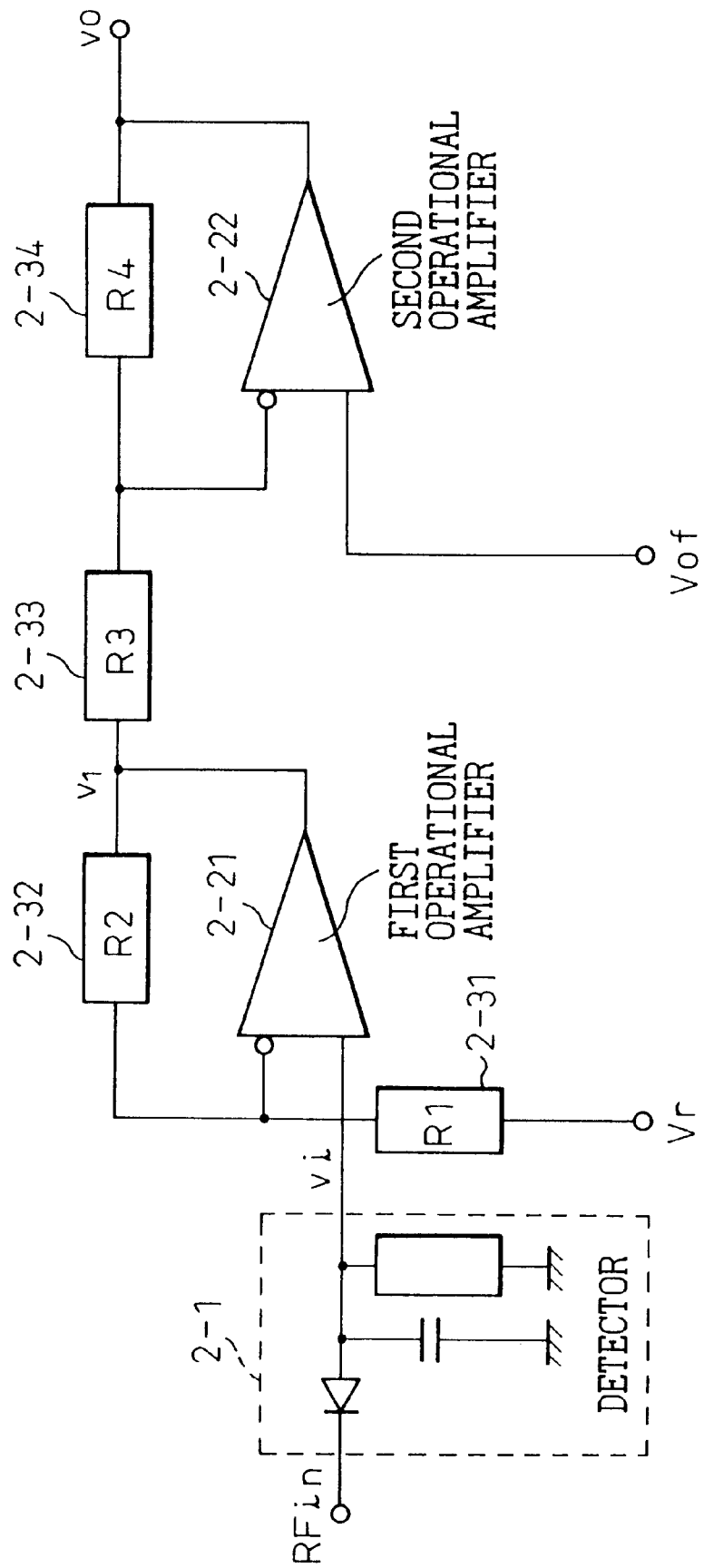
FIG. 2 is a block diagram of the signal level monitoring circuit according to the first embodiment of the present invention.

FIG. 2 is a block diagram of the signal level monitoring circuit according to the first embodiment of the present invention. In FIG. 2, reference number 2-1 is a detector, 2-21 is a first operational amplifier, 2-22 is a second operational amplifier, and 2-31 to 2-34 are resistors. Further, Vr is the offset adjusting voltage applied to the first operational amplifier 2-21, Vof is the offset adjusting voltage applied to the second operational amplifier 2-22, Vi is the input voltage from the detector, $v_1$ is the output voltage of the first operational amplifier 2-21, and vo is the output voltage (i.e., monitor output voltage) of the second operational amplifier 2-22.

In this embodiment, as shown in FIG. 2, the offset adjusting voltage Vr is applied to one terminal of the resistor (R1) 2-31, and the other terminal of the resistor 2-31 is connected to the inverted input terminal of the operational amplifier 2-21.

In this signal level monitoring circuit, the output signal voltage $v_1$ of the first operational amplifier 2-21 can be expressed by the following formula (9), and the output signal voltage vo of the second operational 2-22 can be expressed by the following formula (10).

$$v_1 = (1+(R2/R1))\cdot(vi-Vr)+Vr \tag{9}$$

$$vo = v_1+(1+(R4/R3))\cdot Vof = (1+(R2/R1))\cdot(vi-Vr)+Vr+(1+(R4/R3))\cdot Vof \tag{10}$$

The adjustment of the gain and offset voltage in the signal level monitoring circuit can be performed in accordance with the following steps. First, the offset adjusting voltage Vr is adjusted in such a way that the input voltage is vi, the input voltage $vi_{typ}$ of the standard input signal level $RF_{typ}$ is added, and the output signal voltage $v_1$ of the first operational amplifier 2-21 is equal to the input voltage $vi_{typ}$. At that time, as is obvious from the formula (9), $v_1$ can be expressed by $vi_{typ}$ ($=Vr$), and the value of $v_1$ is not influenced by the gain (R2/R1).

Next, in the state in which the input voltage $vi_{typ}$ of the standard input signal level $RF_{typ}$ is added, the offset adjusting voltage Vof to be added to the second operational amplifier 2-22 is set so that the output voltage (i.e., monitor output voltage) vo of the second operational amplifier 2-22 becomes the reference monitor output level $V_{typ}$.

Finally, the gain of the first operational amplifier 2-21 is set by adjusting either the resistance value R1 or R2 of the first or second resistor 2-31 or 2-32 so that the output voltage (i.e., monitor output voltage) vo of the second operational amplifier 2-22 becomes the minimum monitor output level $V_{min}$. In this case, the DC amplifier formed by the second operational amplifier 2-22 may be a non-inverted type-amplifier.

Figure 3:
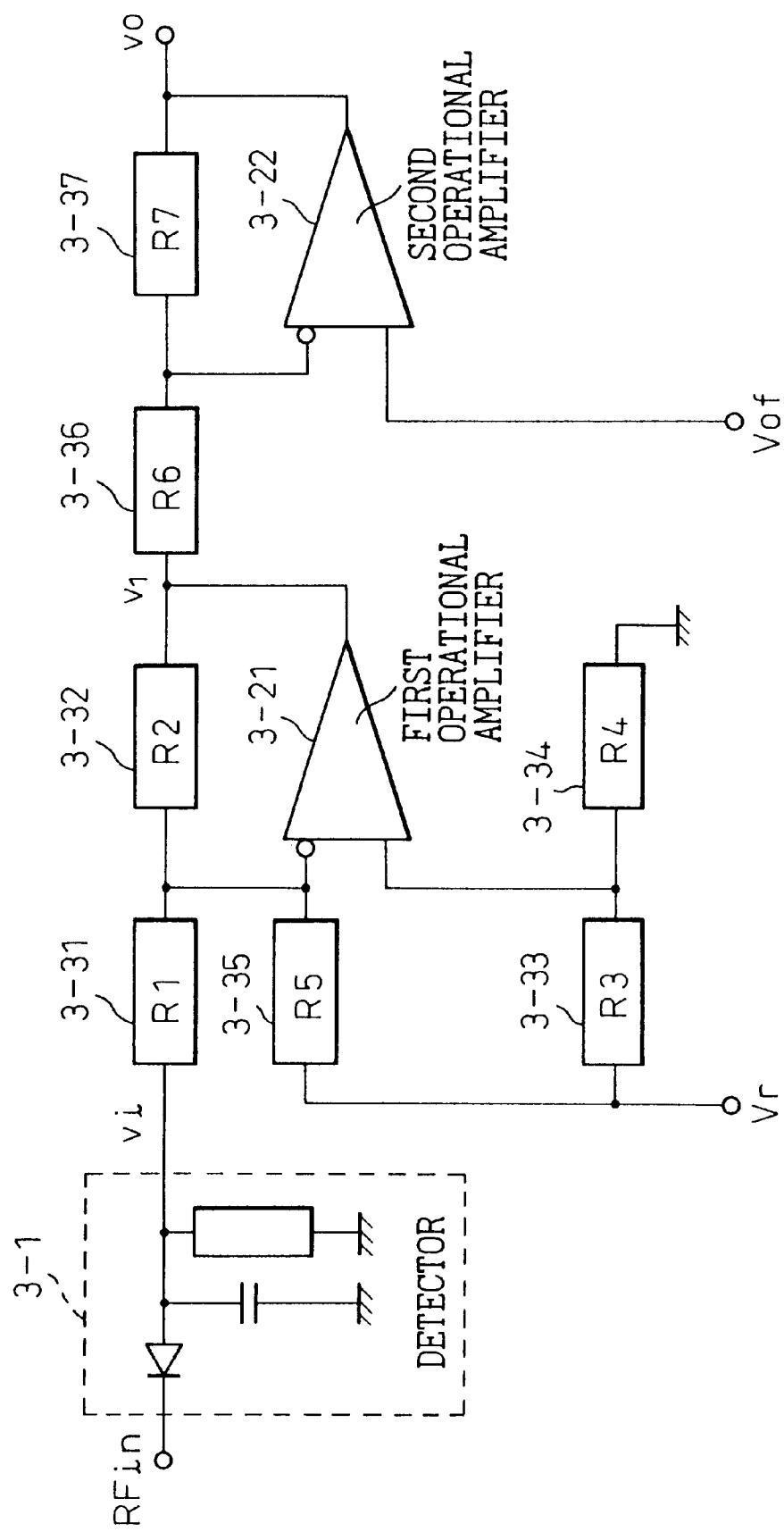
FIG. 3 is a block diagram of the signal level monitoring circuit according to the second embodiment of the present invention.

FIG. 3 is a block diagram of the signal level monitoring circuit according to the second embodiment of the present invention. In FIG. 3, reference number 3-1 is a detector, 3-21 is a first operational amplifier, 3-22 is a second operational amplifier, and 3-31 to 3-37 are resistors. Further, Vr is the offset adjusting voltage applied to the first operational amplifier 3-21 through the resistor, Vof is the offset adjusting voltage applied to the second operational amplifier 3-22, Vi is the input voltage from the detector, $v_1$ is the output voltage of the first operational amplifier 3-21, and vo is the output voltage (i.e., monitor output voltage) of the second operational amplifier 3-22.

The signal level monitoring circuit according to this embodiment has a structure which was modified from an instrumentation amplifier. When the resistors R2 to R5 satisfy the following formula (11), it is possible to obtain the amplified output for the voltage shown by the subtracted voltage, i.e., (vi−Vr) in the following formula (12).

$$R2/R5 = R4/R3 \tag{11}$$

$$v_1 = R2/R1\cdot(vi-Vr) \tag{12}$$

$$vo = R2/R1\cdot(vi-Vr)+(1+R7/R6)\cdot Vof \tag{13}$$

In this embodiment, it is easy to design the circuit since the resistance value RI for determining the gain is not included in the formula (11). The adjustment of the gain and offset voltage in this embodiment is the same as the adjusting steps in FIG. 1.

That is, first, the input voltage $vi_{typ}$ of the standard input signal level $RF_{typ}$ is added, and the offset adjusting voltage Vr is set so that the output voltage $v_1$ of the first operational amplifier 3-21 becomes zero volt. Next, the offset adjusting voltage Vof is set so that the output voltage (monitor output voltage) of the second operational amplifier 3-22 becomes the standard monitor output level $V_{typ}$. Finally, the input voltage $vi_{min}$ of the minimum input signal level $RF_{min}$ is added, and the gain is set by the resistance value R1 so that the output voltage (i.e., monitor output voltage) vo of the second operational amplifier 3-22 becomes the minimum monitor output level $V_{min}$.

In the signal level monitoring circuit, when comparing the second embodiment with the first embodiment shown in FIG. 2, in the second embodiment, it is necessary to structure the resistors R2 and R5 which satisfy the formula (11) by combining these resistors. However, rather than setting the offset adjusting voltage Vr so that the output voltage $v_1$ of the first operational amplifier becomes the input voltage $vi_{typ}$ of the standard input signal level $RF_{typ}$, the adjustment is easy when setting the offset adjusting voltage Vr so that the output voltage $v_1$ of the first operational amplifier becomes zero volt. In this embodiment, the DC amplifier formed by the second operational amplifier 3-22 may be formed by the non-inverted type amplifier.

Figure 4:
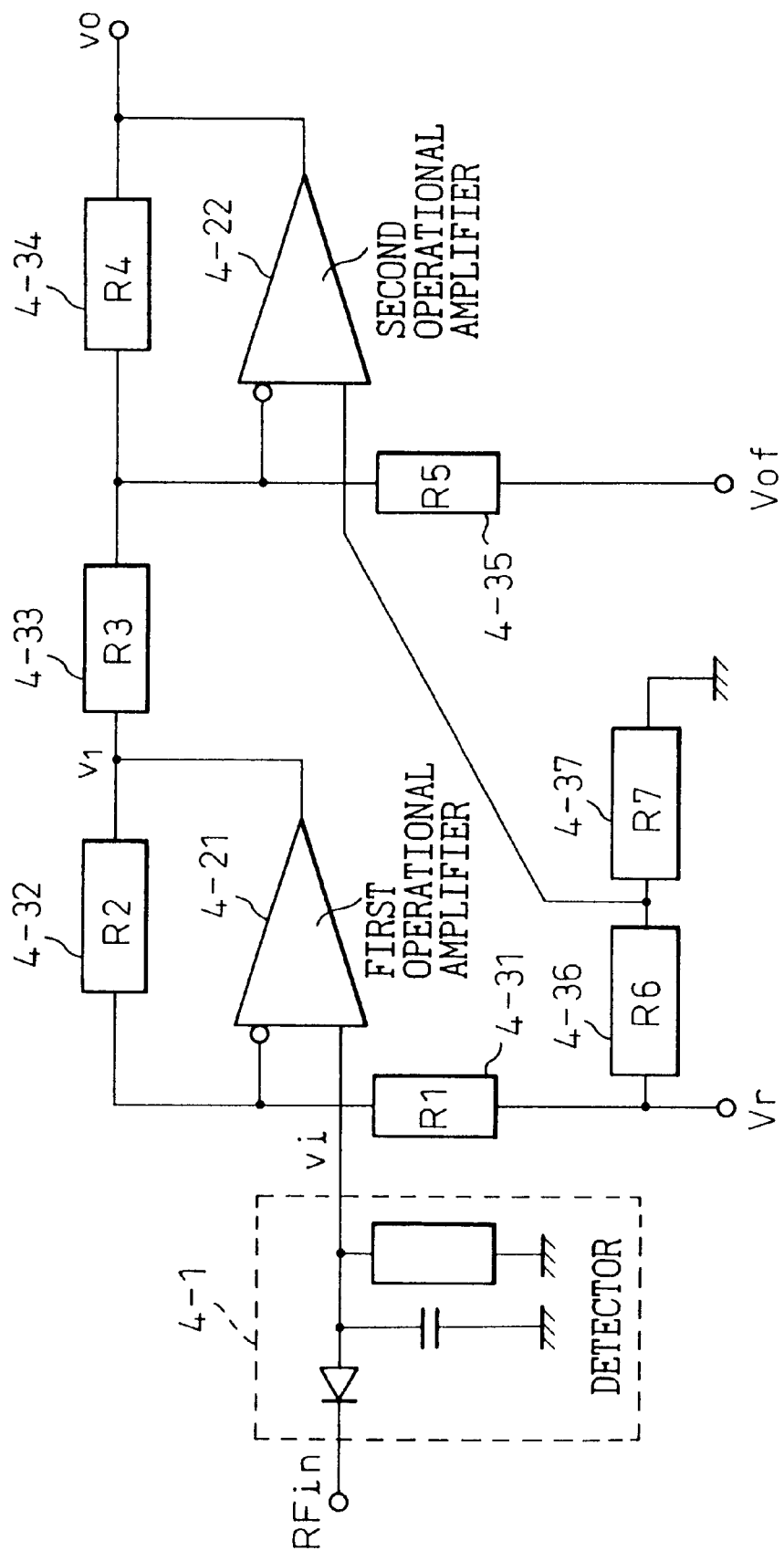
FIG. 4 is a block diagram of the signal level monitoring circuit according to the third embodiment of the present invention.

FIG. 4 is a block diagram of the signal level monitoring circuit according to the third embodiment of the present invention. In FIG. 4, reference number 4-1 is a detector, 4-21 is a first operational amplifier, 4-22 is a second operational amplifier, and 4-31 to 4-37 are resistors. Further, Vr is the offset adjusting voltage applied to the first and second operational amplifiers 4-21 and 4-22 through the resistor, Vof is the offset adjusting voltage applied to the second operational amplifier 4-22, Vi is the input voltage from the detector, $v_1$ is the output voltage of the first operational amplifier 4-21, and vo is the output voltage (i.e., monitor output voltage) of the second operational amplifier 4-22.

As shown by the formula (9), since the output voltage $v_1$ of the first operational amplifier in the first embodiment shown in FIG. 2 includes the second item concerning the voltage Vr, the influence of the offset adjusting voltage Vr is applied to the offset voltage.

In the third embodiment, in order to cancel the second item concerning the voltage Vr of the formula (9), the offset adjusting voltage Vr is applied to the second operational amplifier 4-22 through the resistors 4-36 and 4-37.

The monitor output voltage vo of the signal level monitoring circuit becomes the following formula (5) when the conditions of the formula (14) are satisfied. Both denominators of the right and left sides of the formula (14) represent resistance values at the time when the resistors having the resistance values R4 and R5 are connected in parallel.

$$R7/R6=R3/(R4//R5) \tag{14}$$

$$vo=(1+(R2/R1))\cdot R4/R3\cdot(vi-Vr)-R4/R5\cdot Vof \tag{15}$$

In the adjusting steps of the gain and offset voltage in this embodiment, first, the offset adjusting voltage Vof is zero volt, the input voltage $vi_{typ}$ of the standard input signal level $RF_{typ}$ is added, and the offset adjusting voltage Vr is set so that the output voltage vo of the second operational amplifier 4-22 becomes zero volt. Next, the offset adjusting voltage Vof is set so that the output voltage (i.e., monitor output voltage) becomes the standard monitor output level $V_{typ}$. Finally, the input voltage $vi_{min}$ of the minimum input signal level $RF_{min}$ is added, and the gain is set by the resistance value R1 or R2 so that the output voltage (i.e., monitor output voltage) vo of the second operational amplifier 4-22 becomes the minimum monitor output level $V_{min}$.

Figure 5:
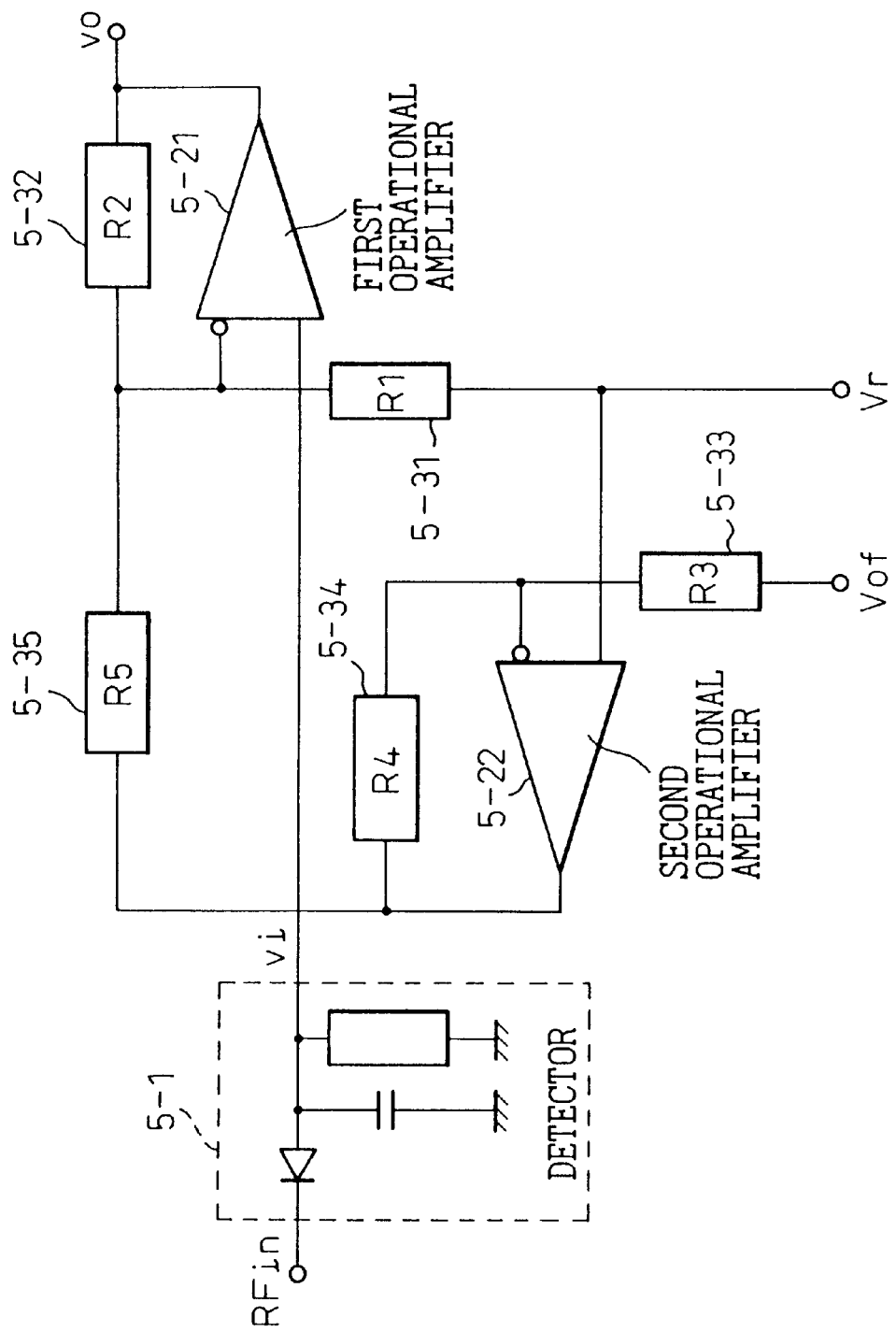
FIG. 5 is a block diagram of the signal level monitoring circuit according to the fourth embodiment of the present invention.

FIG. 5 is a block diagram of the signal level monitoring circuit according to the fourth embodiment of the present invention. In FIG. 5, reference number 5-1 is a detector, 5-21 is a first operational amplifier, 5-22 is a second operational amplifier, and 5-31 to 5-35 are resistors. Further, Vr is the offset adjusting voltage applied to the first and second operational amplifiers 5-21 and 5-22 through the resistor, Vof is the offset adjusting voltage applied to the second operational amplifier 5-22, Vi is the input voltage from the detector, and vo is the output voltage (i.e., monitor output voltage) of the first operational amplifier 5-21.

In the fourth embodiment, a resistor dividing circuit using resistances R3 and R4 of the second embodiment shown in FIG. 3 and a resistor dividing circuit using resistances R6 and R7 of the third embodiment shown in FIG. 4, are replaced by an amplifying circuit using the operational amplifier. Further, the adjustment of the offset voltage is performed by the circuit using the operational amplifier. That is, this is equivalent to the structure in which the offset voltage, which is added to the inverted input terminal of the first operational amplifier 5-21, is connected to the output voltage shown by the following formula (16), through the resistor 5-35.

The monitor output voltage vo of the signal level monitoring circuit in the fourth embodiment is expressed by the following formula (18) when the conditions of the formula (17) are satisfied. In the right side of the formula (18), the denominator represents the resistance value at the time when the resistors having the resistance values RI and R5 are connected in parallel.

$$V(1+(R4/R3))\cdot Vr-(R4/R3)\cdot Vof \tag{16}$$

$$R3/R4=R2/R5 \tag{17}$$

$$vo=(1+R2/(R1//R5))\cdot(vi-Vr)+Vof \tag{18}$$

Since the formula (18) representing the monitor output voltage vo in the fourth embodiment becomes similar to the formula (15) representing the monitor output voltage vo in the third embodiment, the adjustment of the gain and offset voltage of the signal level monitoring circuit in the fourth embodiment is performed by the same adjusting steps as the third embodiment. Accordingly, the same explanations are omitted.

Figure 6:
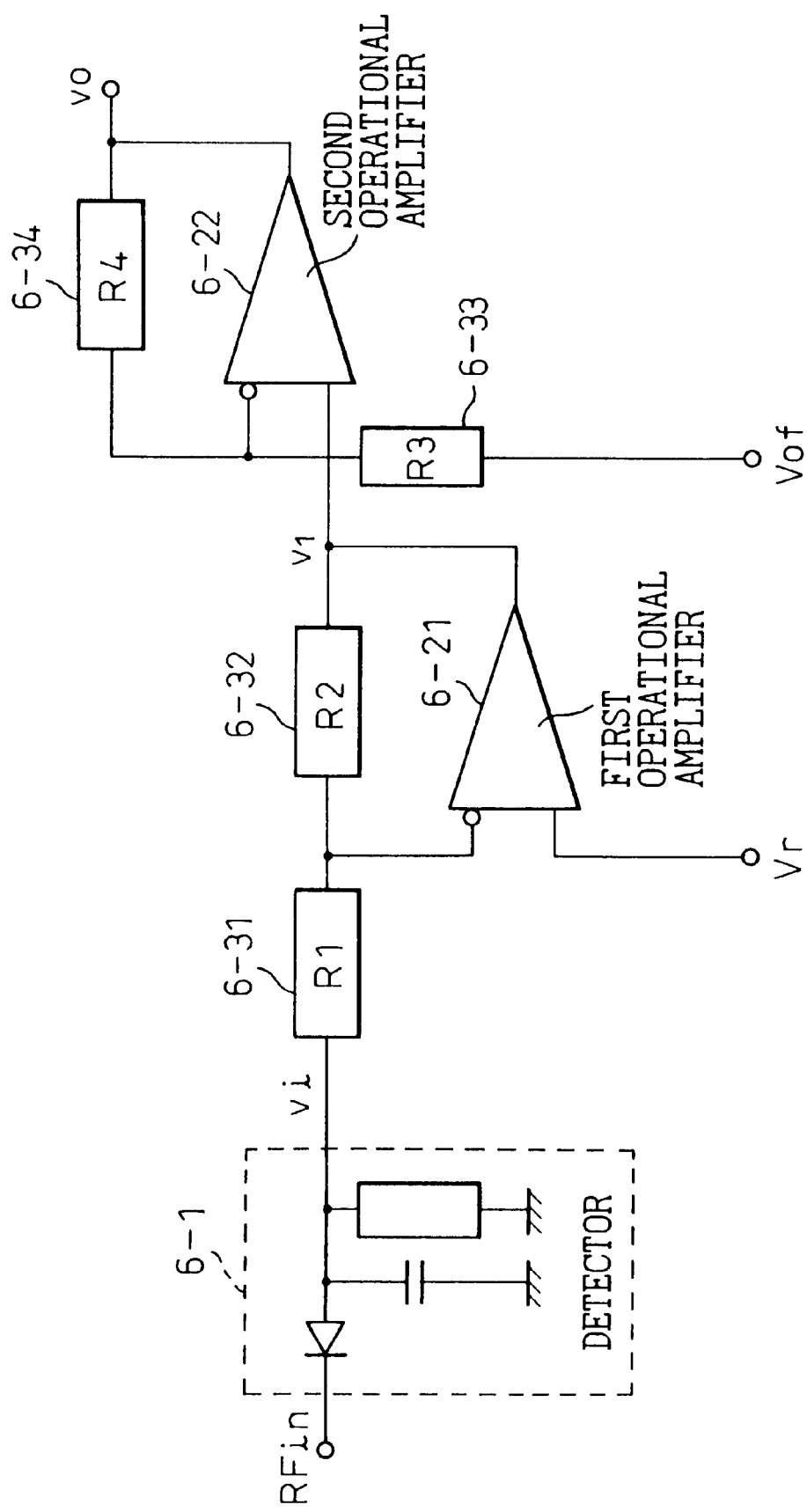
FIG. 6 is a block diagram of the signal level monitoring circuit according to the fifth embodiment of the present invention.

FIG. 6 is a block diagram of the signal level monitoring circuit according to the fifth embodiment of the present invention. In FIG. 6, reference number 6-1 is a detector, 6-21 is a first operational amplifier, 6-22 is a second operational amplifier, and 6-31 to 6-34 are resistors. Further, Vr is the offset adjusting voltage applied to the first operational amplifier 6-21, Vof is the offset adjusting voltage applied to the second operational amplifier 6-22 through the resistor, Vi is the input voltage from the detector, vis the output voltage of the first operational amplifier, and vo is the output voltage (i.e., monitor output voltage) of the second operational amplifier 6-22.

In the signal level monitoring circuit of the fifth embodiment, the output voltage $v_1$ of the first operational amplifier and the output voltage (i.e., monitor output voltage) of the first operational amplifier are shown by the following formula (19) and (20).

$$V_1=-(R2/R1)\cdot(vi-Vr)+Vr \tag{19}$$

$$vo=(1+(R4/R3))\cdot(v_1-Vof)+Vof \tag{20}$$

The adjustment of the gain and offset voltage in the fifth embodiment is based on the voltage Vof of the first and second items in the formula (20). First, the input voltage $vi_{typ}$ of the standard input signal level $RF_{typ}$ is added, and the resistance values R1, R2 and the offset adjusting voltage Vr are set so that the output voltage $v_1$ of the first operational amplifier 6-21 becomes the standard monitor output level $V_{typ}$. At that time, it is possible to use the optional combination of the resistance values R1, R2 and the offset adjusting voltage Vr.

Next, the offset adjusting voltage Vof, which is applied to the second operational amplifier 6-22, is set as the standard monitor output level $V_{typ}$ (i.e., $Vof=V_{typ}$). At that time, as is obvious from the formula (20), the output voltage $vo_{typ}$ of the second operational amplifier 6-22 becomes the standard monitor output level $V_{typ}$, and the output voltage $vo_{typ}$ is not dependent on the resistors R3 and R4 (i.e., the gain of the second amplifier) since the subtracted value at the first item in the formula (20) becomes zero.

Finally, the input voltage $Vi_{min}$ of the minimum input level $RF_{min}$ is added, and the the gain is set by the resistance values R3 and R4 so that the output voltage $vo_{min}$ of the second operational amplifier 6-22 becomes the minimum monitor output level $V_{min}$ (i.e., $vo_{min}=V_{min}$). In this case, the amplifier of the first operational amplifier may be formed by the non-inverted type amplifier.

As explained above, according to the present invention, since the signal level monitoring circuit includes a variable gain unit for obtaining the predetermined output level without being dependent on the gain when the input signal level is the predetermined reference level, and the offset adding unit for outputting the predetermined reference output level by adding the offset to the output level of the variable gain unit when the input signal level becomes the predetermined reference input level, the gain and offset voltage of the signal level monitoring circuit are adjusted so that the output voltage thereof coincides with two reference levels, i.e., the predetermined minimum monitor output level and the standard monitor output level. In this case, only one step is required as the adjusting step so that is is possible to perform precisely and surely the adjustment of the signal level monitoring circuit in a short time.

What is claimed is:

1. A signal level monitoring circuit comprising a first amplifier using a first operational amplifier and a second amplifier using a second operational amplifier and connected to the first amplifier, wherein, an output terminal of a detector (4-1) is connected to one input terminal of the first operational amplifier (4-21);

one terminal of a first resistor (R1) is connected to a first offset adjusting voltage terminal (Vr) and the other terminal of the first resistor (R1) is connected to the other input terminal of the first operational amplifier (4-21);

one terminal of a second resistor (R2) is connected to an output terminal of the first operational amplifier (4-21) and the other terminal of the second resistor (R2) is connected to the other input terminal of the first operational amplifier (4-21);

one terminal of a third resistor (R3) is connected to the output terminal of the first operational amplifier (4-21), and the other terminal of the third resistor (R3) is connected to one input terminal of the second operational amplifier (4-22);

one terminal of a fourth resistor (R4) is connected to an output terminal of the second operational amplifier (4-22), and the other terminal of the fourth resister (R4) is connected to the one input terminal of the second operational amplifier (4-22);

one terminal of a fifth resistor (R5) is connected to a second offset adjusting voltage terminal (Vof), and the other terminal of the fifth resistor (R5) is connected to the one input terminal of the second operational amplifier (4-22);

one terminal of a sixth resistor (R6) is connected to the first offset adjusting voltage terminal (Vr), and the other terminal of the sixth resistor (R6) is connected to the other input terminal of the second operational amplifier (4-22); and one terminal of a seventh resistor (R7) is connected to ground, and the other terminal of the seventh resistor (R7) is connected to the one terminal of the sixth resistor (R6);

wherein a ratio of the resistance values of the seventh and sixth resistors (R7, R6) is equal to a ratio of the resistance value of the third resistor (R3) and a parallel combined resistance value of the fourth and fifth resistors (R4, R5).

2. A signal level monitoring circuit comprising a first amplifier using a first operational amplifier and a second operational amplifier adding an offset voltage to the first amplifier, wherein, an output terminal of a detector (5-1) is connected to one input terminal of the first operational amplifier (5-21);

one terminal of a first resistor (R1) is connected to the other input terminal of the first operational amplifier (5-21), and the other terminal of the first resistor (R1) is connected to a first offset adjusting voltage terminal (Vr);

one terminal of a second resistor (R2) is connected to the other input terminal of the first operational amplifier (5-21), and the other terminal of the second resistor (R2) is connected to an output terminal of the first operational amplifier (5-21);

one input terminal of the second operational amplifier (5-22) is connected to the first offset adjusting voltage terminal (Vr);

one terminal of a third resistor (R3), is connected to the other input terminal of the second operational amplifier (5-22), and the other terminal of the third resistor (R3) is connected to a second offset adjusting voltage terminal (Vof);

one terminal of a fourth resistor (R4) is connected to an output terminal of the second operational amplifier (5-22), and the other terminal of the fourth resistor (R4) is connected to the other input terminal of the second operational amplifier (5-22);

one terminal of a fifth resistor (R5) is connected to the output terminal of the second operational amplifier (5-22), and the output terminal of the second operational amplifier (5-22) is connected to the other input terminal of the first operational amplifier (5-21) through the fifth resistor (R5);

wherein a ratio of the resistance values of the third and fourth resistors (R3, R4) is equal to a ratio of the resistance values of the second and fifth resistors (R2, R5).

* * * * *